US011287333B2

(12) United States Patent
Wang et al.

(10) Patent No.: US 11,287,333 B2
(45) Date of Patent: Mar. 29, 2022

(54) PRESSURE SENSING UNIT AND PRESSURE SENSOR, PRESSURE SENSING DEVICE

(71) Applicants: Hefei Xinsheng Optoelectronics Technology Co., Ltd., Anhui (CN); BOE TECHNOLOGY GROUP CO., LTD., Beijing (CN)

(72) Inventors: Qinghe Wang, Beijing (CN); Dongfang Wang, Beijing (CN); Bin Zhou, Beijing (CN); Ce Zhao, Beijing (CN); Tongshang Su, Beijing (CN); Leilei Cheng, Beijing (CN); Yang Zhang, Beijing (CN); Guangyao Li, Beijing (CN)

(73) Assignees: Hefei Xinsheng Optoelectronics Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 157 days.

(21) Appl. No.: 16/614,788

(22) PCT Filed: May 17, 2019

(86) PCT No.: PCT/CN2019/087433
§ 371 (c)(1),
(2) Date: Nov. 18, 2019

(87) PCT Pub. No.: WO2019/219081
PCT Pub. Date: Nov. 21, 2019

(65) Prior Publication Data
US 2021/0018377 A1 Jan. 21, 2021

(30) Foreign Application Priority Data
May 18, 2018 (CN) .......................... 201810486991.7

(51) Int. Cl.
*G01L 1/00* (2006.01)
*H01L 29/84* (2006.01)
(Continued)

(52) U.S. Cl.
CPC ............ *G01L 1/005* (2013.01); *G06F 3/0412* (2013.01); *H01L 29/72* (2013.01); *H01L 29/84* (2013.01); *G01L 1/16* (2013.01); *G01L 9/08* (2013.01)

(58) Field of Classification Search
CPC combination set(s) only.
See application file for complete search history.

(56) References Cited

U.S. PATENT DOCUMENTS 7,629,633 B2 12/2009 Chan et al.
9,214,644 B2 12/2015 Rinzler et al.
(Continued)

FOREIGN PATENT DOCUMENTS

AU 2011338460 A1 6/2013
CN 105336857 A 2/2016
(Continued)

OTHER PUBLICATIONS

Chen, et al., "Progress in Organic Field-Effect Transistors and Its Applications", Journal of Nanjing University of Posts and Telecommunications (Natural Science Edition), vol. 31, Issue 03, Jun. 30, 2011, 36 pages.
(Continued)

*Primary Examiner* — Moin M Rahman
*Assistant Examiner* — Mohammad A Rahman
(74) *Attorney, Agent, or Firm* — Arch & Lake LLP

(57) ABSTRACT

A pressure sensing unit includes: a first substrate and a second substrate opposite to each other; and at least one vertical thin film transistor disposed between the first substrate and the second substrate. Each vertical thin film
(Continued)

transistor includes a first electrode, a semiconductor active layer, a second electrode, at least one insulating support, and a gate electrode sequentially disposed in a direction extending from the first substrate to the second substrate. A first air gap is formed by the presence of the at least one insulating support between the gate electrode and the second electrode of each vertical thin film transistor.

20 Claims, 5 Drawing Sheets

(51) Int. Cl.
*G06F 3/041* (2006.01)
*H01L 29/72* (2006.01)
*G01L 1/16* (2006.01)
*G01L 9/08* (2006.01)

(56) References Cited

U.S. PATENT DOCUMENTS

| | | | |
|---|---|---|---|
| 9,455,421 | B2 | 9/2016 | Li |
| 2013/0240842 | A1 | 9/2013 | Rinzler et al. |
| 2015/0155430 | A1 | 6/2015 | Li |
| 2016/0359144 | A1 | 12/2016 | Li |
| 2017/0016930 | A1* | 1/2017 | Qiu .................. G02F 1/1339 |
| 2017/0364183 | A1 | 12/2017 | Xiao |
| 2018/0219055 | A1 | 8/2018 | Bu et al. |
| 2019/0004648 | A1 | 1/2019 | Xu et al. |

FOREIGN PATENT DOCUMENTS

| | | |
|---|---|---|
| CN | 106104441 A | 11/2016 |
| CN | 106293244 A | 1/2017 |
| CN | 106525293 A | 3/2017 |
| CN | 106684251 A | 5/2017 |
| CN | 106887449 A | 6/2017 |
| CN | 107389256 A | 11/2017 |
| CN | 107946369 A | 4/2018 |
| CN | 108731855 A | 11/2018 |
| EP | 2 649 659 A2 | 10/2013 |
| EP | 3 293 617 A1 | 3/2018 |
| SG | 190313 A1 | 6/2013 |
| WO | WO-2012/078759 A2 | 6/2012 |
| WO | WO-2015/077629 A1 | 5/2015 |
| WO | WO-2016/042707 A1 | 3/2016 |
| WO | WO-2019/101133 A1 | 5/2019 |

OTHER PUBLICATIONS

Chinese Notification to Grant Patent Right for Invention dated Jun. 28, 2019, from application No. 201810486991.7.
Huang-Ping, et al., "MOS field effect transistor pressure microsensor", Sensor Technology, vol. 20, Iss. 5, May 30, 2001, 10 pages.
International Search Report and Written Opinion dated Jul. 25, 2019, from application No. PCT/CN2019/087433.

* cited by examiner

PRESSURE SENSING UNIT AND PRESSURE SENSOR, PRESSURE SENSING DEVICE

CROSS-REFERENCE TO RELATED APPLICATIONS

This application is based upon International Application No. PCT/CN2019/087433, filed on May 17, 2019, which claims the priority of the Chinese Patent Application No. 201810486991.7, entitled "PRESSURE SENSING UNIT AND PRESSURE SENSOR, PRESSURE SENSING DEVICE", filed on May 18, 2018 with Chinese Patent Office, the entire contents of which are hereby incorporated by reference.

TECHNICAL FIELD

The present disclosure relates to the field of electronic technologies, in particular, to a pressure sensing unit, a pressure sensor, and a pressure sensing device.

BACKGROUND

In recent years, the development of sensors has received extensive attention and research. Moreover, with the rapid development of artificial intelligence, wearable electronic devices, and the Internet of Things, sensors and related devices are also developing in the direction of high sensitivity, multi-type, flexibility, and small size.

SUMMARY

In one aspect, a pressure sensing unit is provided. The pressure sensing unit includes a first substrate and a second substrate opposite to each other, and at least one vertical thin film transistor disposed between the first substrate and the second substrate. Each vertical thin film transistor includes a first electrode, a semiconductor active layer, a second electrode, at least one insulating support, and a gate electrode sequentially disposed in a direction from the first substrate to the second substrate. A first air gap is formed by the presence of the at least one insulating support between the gate electrode and the second electrode of each vertical thin film transistor.

In some arrangements, the pressure sensing unit further includes at least one lateral thin film transistor disposed between the first substrate and the second substrate. Each lateral thin film transistor includes a gate electrode, a first electrode, a second electrode, and a semiconductor active layer. The first electrode and the second electrode of each lateral thin film transistor are respectively disposed in the same layer as the first electrode of each vertical thin film transistor; the first electrode of each lateral thin film transistor is connected to the first electrode of an adjacent vertical thin film transistor. The gate electrode of each lateral thin film transistor is disposed in the same layer as the gate electrode of each vertical thin film transistor; the semiconductor active layer of each lateral thin film transistor is disposed in the same layer as the semiconductor active layer of each vertical thin film transistor. A second air gap is formed between the gate electrode and the semiconductor active layer of each lateral thin film transistor.

In some arrangements, the second air gap in each of the lateral thin film transistors is formed by the presence of the at least one insulating support in an adjacent vertical thin film transistor.

In some arrangements, the first electrode of each lateral thin film transistor is in an integral structure with the first electrode of the adjacent vertical thin film transistor. The semiconductor active layer of each lateral thin film transistor is in an integral structure with the semiconductor active layer of the adjacent vertical thin film transistor; and/or the gate electrode of each lateral thin film transistor is in an integral structure with the gate electrode of the adjacent vertical thin film transistor.

In some arrangements, one of the vertical thin film transistors and one of the lateral thin film transistors connected to the first electrode of said one vertical thin film transistor constitute a pressure sensing subunit; the pressure sensing unit includes at least one pressure sensing subunit group, and each pressure sensing subunit group includes two pressure sensing subunits symmetrically centered on a reference plane; and the reference plane is a plane passing through a geometric center of the first substrate and perpendicular to the first substrate.

In some arrangements, in each pressure sensing subunit group, two lateral thin film transistors are disposed between the two vertical thin film transistors, and the second electrodes of the two lateral thin film transistors are connected to each other.

In some arrangements, the number of the pressure sensing subunit groups is two, and the two pressure sensing subunit groups are arranged in a crossing manner. Four lateral thin film transistors in the two pressure sensing subunit groups are dispose inside the four vertical thin film transistors, and the second electrodes of the four lateral thin film transistors are connected to one another. In addition, the second electrodes of the four lateral thin film transistors form an integral structure.

In some arrangements, the number of the vertical thin film transistors and the number of the lateral thin film transistors are both one. The first electrode and the second electrode of the vertical thin film transistor and the first electrode of the lateral thin film transistor each is a ring-shaped structure; the first electrode of the lateral thin film transistor is disposed inside the first electrode of the vertical thin film transistor. The second electrode of the lateral thin film transistor is a planar structure, and the second electrode of the lateral thin film transistor is disposed inside the first electrode of the same lateral thin film transistor.

In some arrangements, the first substrate and the second substrate are both flexible substrates.

In another aspect, a pressure sensor is provided. The pressure sensor includes at least one pressure sensing unit according to some of the above arrangements.

In still another aspect, a pressure sensing device is provided. The pressure sensing device includes the pressure sensor described above.

BRIEF DESCRIPTION OF THE DRAWINGS

The drawings described herein are provided to provide a further understanding of the disclosure and constitute a part of this disclosure. The illustrative arrangements of the present disclosure and the description thereof are for explaining the present disclosure and do not constitute an undue limitation of the present disclosure. In the drawing.

DETAILED DESCRIPTION

The technical solutions in some arrangements of the present disclosure are clearly and completely described in the following with reference to the accompanying drawings in the arrangements of the present disclosure. Apparently, the described arrangements are only a part of the arrangements of the present disclosure, but not all arrangements. All other arrangements obtained by a person of ordinary skill in the art based on the arrangements of the present disclosure without paying creative effort all belong to the protection scope of the present disclosure.

Unless otherwise defined, technical terms or scientific terms used in some arrangements of the present disclosure should be understood in the ordinary meaning of those of ordinary skill in the art. The terms "first", "second", and similar terms used in some arrangements of the present disclosure do not denote any order, quantity, or importance, but are used to distinguish different components. The word "comprising" or "including" or the like means that the element or item preceding the word is intended to cover elements or items listed after the word and their equivalents, without excluding other elements or items. The words "connected" or "coupled" and the like are not limited to physical or mechanical connections, but may include electrical connections, whether direct or indirect. "Upper", "lower", "left", "right", etc. are only used to indicate the relative positional relationship, and when the absolute position of the object to be described is changed, the relative positional relationship may also change accordingly.

Pressure sensors are widely used in fields such as intelligent bionic robots, life health, mobile life, wearable electronic devices, etc. since they can sense changes in pressure signals. Pressure sensors typically include a plurality of pressure sensing units. Of course, it is also possible if the pressure sensor consists of only one pressure sensing unit, if necessary.

Figure 1:
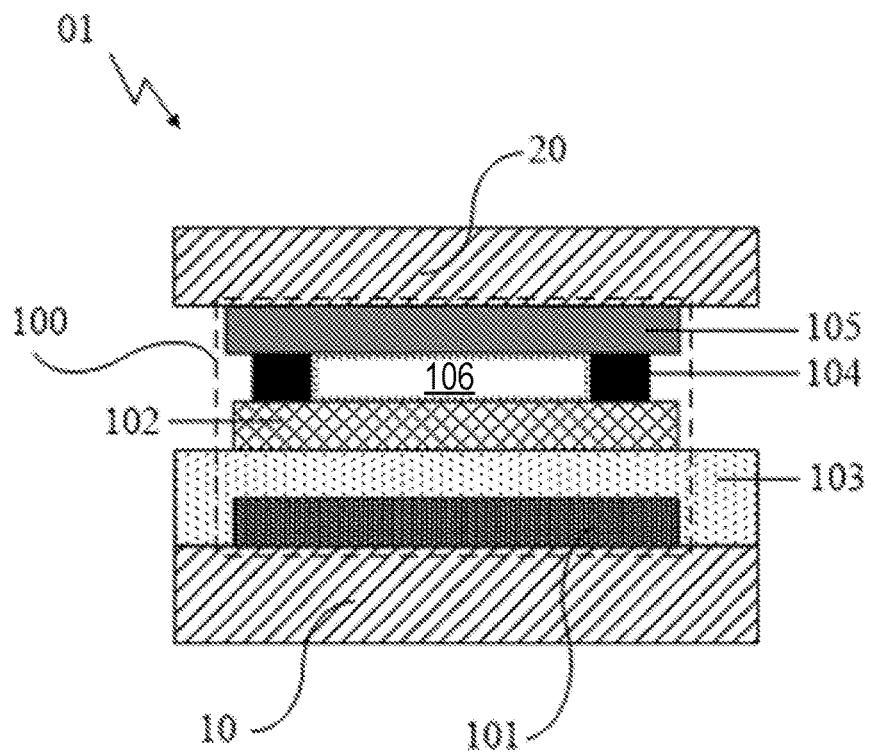
FIG. 1 is a schematic structural diagram of a pressure sensing unit according to some arrangements of the present disclosure.

In view of this, some arrangements of the present disclosure provide a pressure sensing unit. As shown in FIG. 1, the pressure sensing unit 01 includes a first substrate 10 and a second substrate 20 disposed opposite to each other, and at least one vertical thin film transistor (VTFT) 100 disposed between the first substrate 10 and the second substrate 20. Each vertical thin film transistor 100 includes a first electrode 101, a semiconductor active layer 103, a second electrode 102, at least one insulating support 104, and a gate electrode 105 sequentially disposed in a direction from the first substrate 10 to the second substrate 20. Between the gate electrode 105 and the second electrode 102 of each vertical thin film transistor 100, there is a first air gap 106 formed by the presence of the at least one insulating support 104.

It should be understood here that the first electrode 101 and the second electrode 102 in each vertical thin film transistor 100 are one source electrode and one drain electrode. For example, the first electrode 101 in each vertical thin film transistor 100 is a source electrode, and the second electrode 102 is a drain electrode; or, for example, the first electrode 101 in each vertical thin film transistor 100 is a drain electrode, and the second electrode 102 is a source electrode. Some arrangements of the present disclosure do not limit this. Further, if there are a plurality of vertical thin film transistors 100 between the first substrate 10 and the second substrate 20, the plurality of vertical thin film transistors 100 are arranged in an array in a direction parallel to the first substrate 10.

At least one insulating support 104 is disposed between the second electrode 102 and the gate electrode 105 of each vertical thin film transistor 100, and the at least one insulating support 104 is configured so that the first air gap 106 is formed between the corresponding second electrode 102 and the gate electrode 105. Therefore, the at least one insulating support 104 partially covers the corresponding second electrode 102, and the area of the at least one insulating support 104 covering the corresponding second electrode 102 is small. In this case, the gate electrode 105 and the second electrode 102 of each vertical thin film transistor 100 are insulated by the first air gap 106, and the first air gap 106 corresponds to the gate insulating layer of the corresponding vertical thin film transistor.

Thus, when one side of the gate electrode 105 of the vertical thin film transistor 100 is pressed (that is, the second substrate 20 is pressed), the dimension of the first air gap 106 (i.e., the thickness of the gate insulating layer) between the gate electrode 105 and the second electrode 102 of the vertical thin film transistor 100 in the direction perpendicular to the first substrate 10 may change such that the gate capacitance between the gate electrode 105 and the second electrode 102 of the vertical thin film transistor 100 changes, and thus the channel current of the vertical thin film transistor 100 can change. In view of this, based on the surface transmission of the vertical thin film transistor and the mechanism for easily obtaining a large current signal change, with the pressure sensing unit 01 in some arrangements of the present disclosure, for a slight force on one side of the gate electrode 105 of the vertical thin film transistor 100, that is, when one side of the gate electrode 105 of the vertical thin film transistor 100 is slightly touched or pressed, the vertical thin film transistor 100 can be caused to generate a large current fluctuation. Thus, the pressure sensing unit 01 in some arrangements of the present disclosure has a higher pressure sensing sensitivity. It should be noted that, for the forming process of the first air gap 106 in each vertical thin film transistor 100 described above, those skilled in the art should understand that in practice, it is possible to sequentially form the first electrode 101, the semiconductor active layer 103, the second electrode 102 and at least one insulating support 104 of each vertical thin film transistor 100 on the first substrate 10, and form the gate electrode 105 of each vertical thin film transistor 100 on the second substrate 20, then the side of the second substrate 20 on which the gate electrode 105 is formed is assembled with the side of the first substrate 10 on which the at least one insulating support 104 is formed, such that a first air gap 106 is formed by the presence of the at least one insulating support 104 between the gate electrode 105 and the second electrode 102 of each vertical thin film transistor 100.

In addition, each film layer (for example, the first electrode 101, the second electrode 102, and the like) of any vertical thin film transistor 100 in the pressure sensing unit 01 is usually formed by a patterning process. In some examples, the patterning process includes a photolithography process, or a process including a photolithography process and an etching step. The photolithography process refers to a process including forming a film (for example, chemical vapor deposition, chemical vapor deposition, CVD), exposure, development, and the like, and forming a pattern using a photoresist, a mask, an exposure machine, or the like. Of course, in other examples, the patterning process is a process for printing, ink jetting, etc., for forming a predetermined pattern.

Figure 2:
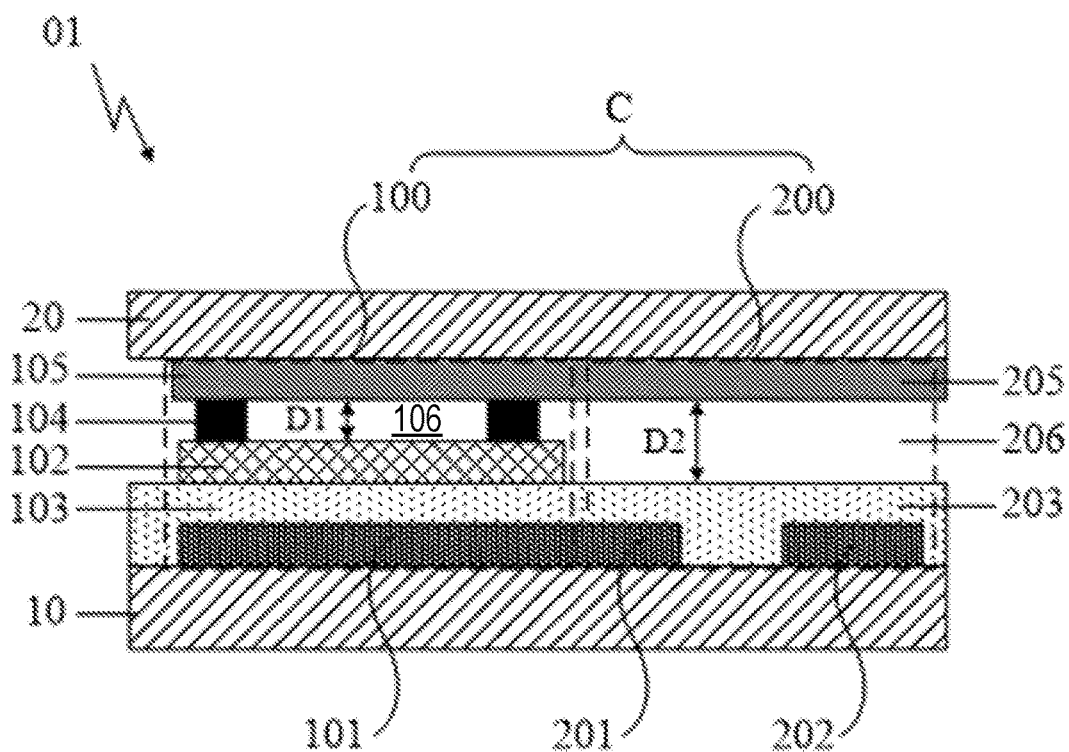
FIG. 2 is a schematic structural diagram of another pressure sensing unit according to some arrangements of the present disclosure.

In some arrangements, as shown in FIG. 2, the pressure sensing unit 01 further includes at least one lateral thin film transistor 200 (LTFT) disposed between the first substrate 10 and the second substrate 20. Each lateral thin film transistor 200 includes a gate electrode 205, a first electrode 201, a second electrode 202, and a semiconductor active layer 203. The first electrode 201 and the second electrode 202 of each lateral thin film transistor 200 are respectively disposed in the same layer as the first electrodes 101 of each vertical thin film transistor 100 described above. The first electrode 201 of each lateral thin film transistor 200 is connected to the first electrode 101 of an adjacent vertical thin film transistor 100. The gate electrode 205 of each lateral thin film transistor 200 is disposed in the same layer as the gate electrode 105 of each vertical thin film transistor 100 described above. The semiconductor active layer 203 of each lateral thin film transistor 200 is disposed in the same layer as the semiconductor active layer 103 of each vertical thin film transistor 100 described above. There is a second air gap 206 between the gate electrode 205 and the semiconductor active layer 203 of each lateral thin film transistor 200. It should be understood here that the first electrode 201 and the second electrode 202 in each lateral thin film transistor 200 are one source electrode and one drain electrode. For example, the first electrode 201 in each lateral thin film transistor 200 is a source electrode, and the second electrode 202 is a drain electrode; or, for example, the first electrode 201 in each lateral thin film transistor 200 is a drain electrode, the second electrode 202 is a source electrode. Some arrangements of the present disclosure do not limit this. It should be noted, however, when the first electrode 201 of each lateral thin film transistor 200 is connected to the first electrode 101 of an adjacent vertical thin film transistor 100, the first electrode 201 of each lateral thin film transistor 200 and the first electrode 101 of the adjacent vertical thin film transistor 100 are both drain electrodes or both are source electrodes.

In addition, the first electrode 201 and the second electrode 202 of each lateral thin film transistor 200 are respectively disposed in the same layer as the first electrode 101 of each vertical thin film transistor 100, that is, that the first electrode 201 and the second electrode 202 of each lateral thin film transistor 200 are respectively made of the same conductive material with the first electrode 101 of each vertical thin film transistor 100 described above by the same patterning process.

The gate electrode 205 of each lateral thin film transistor 200 is disposed in the same layer as the gate electrode 105 of each vertical thin film transistor 100, that is, the gate electrode 205 of each lateral thin film transistor 200 is made of the same conductive material with the gate electrode 105 of each vertical thin film transistor 100 described above by the same patterning process.

The semiconductor active layer 203 of each lateral thin film transistor 200 is disposed in the same layer as the semiconductor active layer 103 of each vertical thin film transistor 100, that is, the semiconductor active layer 203 of each lateral thin film transistor 200 is made of the same conductive material with the semiconductor active layer 103 of each vertical thin film transistor 100 described above by the same patterning process.

It can be understood that, when no insulating support is provided between the gate electrode 205 and the semiconductor active layer 203 in each lateral thin film transistor 200, the second air gap 206 in each lateral thin film transistor 200 is formed by the presence of the at least one insulating support 104 in an adjacent vertical thin film transistor 100. That is to say, at least one vertical thin film transistor 100 is provided around the periphery of each lateral thin film transistor 200, and the at least one insulating support 104 of the at least one vertical thin film transistor 100 may, while forming the corresponding first air gap 106, further form a second air gap 206 between the gate electrode 205 and the semiconductor active layer of the lateral thin film transistors 200 (such as that shown in FIG. 2).

The second air gap 206 in each lateral thin film transistor 200 has the same function as the first air gap 106 in each vertical thin film transistor 100 described above. Therefore, the operation of each lateral thin film transistor 200 is substantially the same as that of each vertical thin film transistor 100 described above, and details are not described herein. As can be seen from the above, each of the film layers in each lateral thin film transistor 200 can be formed by performing a patterning process with a corresponding film layer in each vertical thin film transistor 100 described above. Therefore, some arrangements of the present disclosure can obtain a large current fluctuation by using at least one vertical thin film transistor 100 and at least one lateral thin film transistor 200 in combination, without increasing the fabrication process, thus further improving the sensitivity of the pressure sensing unit 01 (and of the sensor in which the pressure sensing unit 01 is disposed).

It can be understood that, referring to FIG. 2, the first electrode 201 and the second electrode 202 of each lateral thin film transistor 200 are disposed in the same layer, such that the dimension D2 of the second air gap 206 (i.e., the thickness of the gate insulating layer) in the lateral thin film transistor 200 in the direction perpendicular to the first substrate 10 may be larger than the dimension D1 of the first air gap 106 (i.e., the thickness of the gate insulating layer) in the corresponding vertical thin film transistor 100 in the direction perpendicular to the first substrate 10. In this way, when the pressure sensing unit 01 is pressed, if the first air gap 106 in the corresponding vertical thin film transistor 100 reaches the deformation limit (that is, the vertical thin film transistor 100 reaches the maximum current variation limit value), the second air gap 206 in the lateral thin film transistor 200 adjacent to the vertical thin film transistor still can be further deformed, that is, the output current of the lateral thin film transistor 200 still can be further changed. That is to say, at least one lateral thin film transistor 200 is disposed in the pressure sensing unit 01, which can enhance and supplement the pressure detection of each vertical thin film transistor 100, thus increasing the pressure detection range of the pressure sensing unit 01 while increasing the sensitivity of the pressure sensing unit 01 (and of the sensor in which the pressure sensing unit 01 is disposed)

In some arrangements, referring to FIG. 2, the first electrode 201 of each lateral thin film transistor 200 is in an integral structure with the first electrode 101 of an adjacent vertical thin film transistor 100; and/or the semiconductor active layer 203 of each lateral thin film transistor 200 is in an integral structure with the semiconductor active layer 103 of an adjacent vertical thin film transistor 100; and/or the gate electrode 205 of each lateral thin film transistor 200 is in an integral structure with the gate electrode 105 of an adjacent vertical thin film transistor 100.

Here, "and/or" is merely an association relationship describing an associated object, indicating that there may be three relationships. For example, A and/or B indicate that only A exists; both A and B exist; and only B exists. In addition, the character "/" herein generally means that the associated objects in the context is in an "or" relationship. In some arrangements of the present disclosure, the examples will not be described one by one, and those skilled in the art can reasonably obtain each of the corresponding combinations according to the above-described features.

Of course, some of the following arrangements are examples of features described above are in "and" relationship, that is, the first electrode 201 of each lateral thin film transistor 200 is in an integral structure with the first electrode 101 of an adjacent vertical thin film transistor 100; the semiconductor active layer 203 of each lateral thin film transistor 200 is in an integral structure with the semiconductor active layer 103 of an adjacent vertical thin film transistor 100; and the gate electrode 205 of each lateral thin film transistor 200 is in an integral structure with the gate electrode 105 of an adjacent vertical thin film transistor 100. This is advantageous in reducing the total resistance of the pressure sensing unit 01 to avoid attenuation of the sensing signal of the pressure sensing unit 01. In addition, the pressure sensing unit 01 of the above structure can also simplify the manufacturing process, reduce the manufacturing cost, and improve the degree of integration and the like.

The above-mentioned "in an integral structure with" may indicate that a unitary structure in which the two components are in the same layer, made of the same material and connected to each other. It should be understood that the two components are processed by the same manufacturing process. For example, the first electrode 201 of each lateral thin film transistor 200 and the first electrode 101 of an adjacent vertical thin film transistor 100 are in a unitary structure (also known as an integral structure) in which the two are in the same layer, made of the same material, connected to each other and processed by one manufacturing process.

Some arrangements of the present disclosure do not limit the number of vertical thin film transistors 100 and the number of the lateral thin film transistors 200 in the pressure sensing unit 01.

For example, as shown in FIG. 1, the pressure sensing unit 01 includes one vertical thin film transistor 100; or, the pressure sensing unit 01 includes two or more vertical thin film transistors 100.

Figure 3:
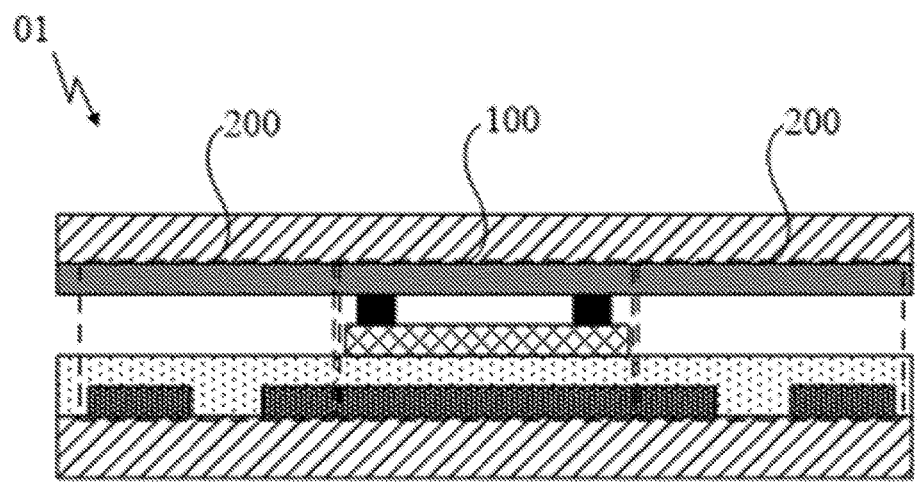
FIG. 3 is a schematic structural diagram of still another pressure sensing unit according to some arrangements of the present disclosure.

For example, as shown in FIG. 2, the pressure sensing unit 01 includes one vertical thin film transistor 100 and one lateral thin film transistor 200 arranged side by side in a direction parallel to the first substrate 10; or, the pressure sensing unit 01 includes one vertical thin film transistor 100 and a plurality of lateral thin film transistors 200 disposed around the vertical thin film transistor 100. For example, as shown in FIG. 3, the pressure sensing unit 01 includes one vertical thin film transistor 100, and two lateral thin film transistors 200 respectively disposed on the left and right sides of the vertical thin film transistor 100. Of course, the pressure sensing unit 01 includes one vertical thin film transistor 100, and four lateral thin film transistors 200 respectively disposed on the left, right, front, and rear sides of the vertical thin film transistor 100, which is also possible. Some arrangements of the present disclosure do not limit this, and in practice, the configuration may be selected as needed.

In some arrangements, one vertical thin film transistor 100 and one lateral thin film transistor 200 connected to the first electrode 101 of the vertical thin film transistor 100 are used as a pressure sensing subunit C, such as shown in FIG. 2.

Here, it should be understood that one pressure sensing subunit C per se constitutes one pressure sensing unit 01; or, it is also possible that a plurality of pressure sensing subunits C (for example two, three or four) integrally constitute a pressure sensing unit 01, which is not limited in some arrangements of the present disclosure.

In some arrangements, the pressure sensing unit 01 includes two or more pressure sensing subunits C capable of acquiring large current fluctuations to improve sensitivity of the pressure sensing unit 01 (and of the sensor in which the pressure sensing unit 01 is disposed).

Figure 4:
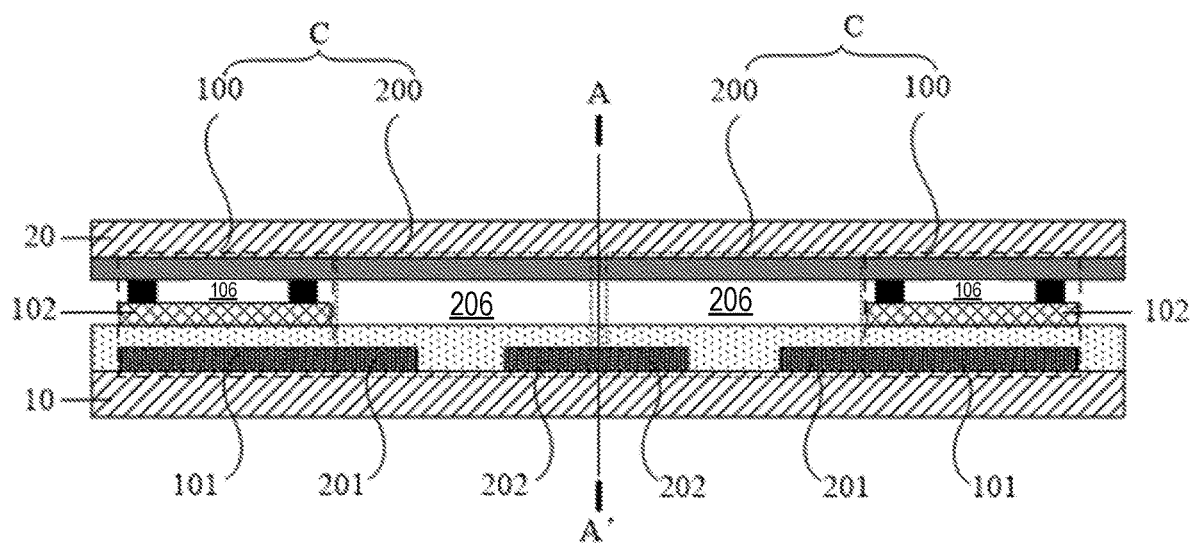
FIG. 4 is a schematic structural diagram of a pressure sensing subunit group according to some arrangements of the present disclosure.

In view of this, considering the acquisition mode of the sensing signal (such as current signal) in the pressure sensing unit 01 and the overall layout of each type of thin film transistor (for example, reducing the projected area of the pressure sensing unit 01 as much as possible), in some arrangements, referring to FIG. 4, the pressure sensing unit 01 includes at least one pressure sensing subunit group, and each pressure sensing subunit group includes two pressure sensing subunits C symmetrically centered on a reference plane (for example, A-A' plane). The reference plane is a plane passing through the geometric center of the first substrate 10 and perpendicular to the first substrate 10.

In addition, referring to FIG. 4, in each pressure sensing subunit group, two lateral thin film transistors 200 are disposed between the two vertical thin film transistors 100, and the second electrodes of the two lateral thin film transistors 200 are connected to each other. For example, the second electrodes of the two lateral thin film transistors 200 are of an integral structure in the same layer and made of the same material. The first electrode 201 of each lateral thin film transistor 200 is connected to, or is of a unitary structure with, the first electrode 101 of the vertical thin film transistor 100 in the same pressure sensing subunit.

The number of the pressure sensing subunits in the pressure sensing unit 01 may be selected as needed, which is not limited in some arrangements of the present disclosure.

Figure 5:
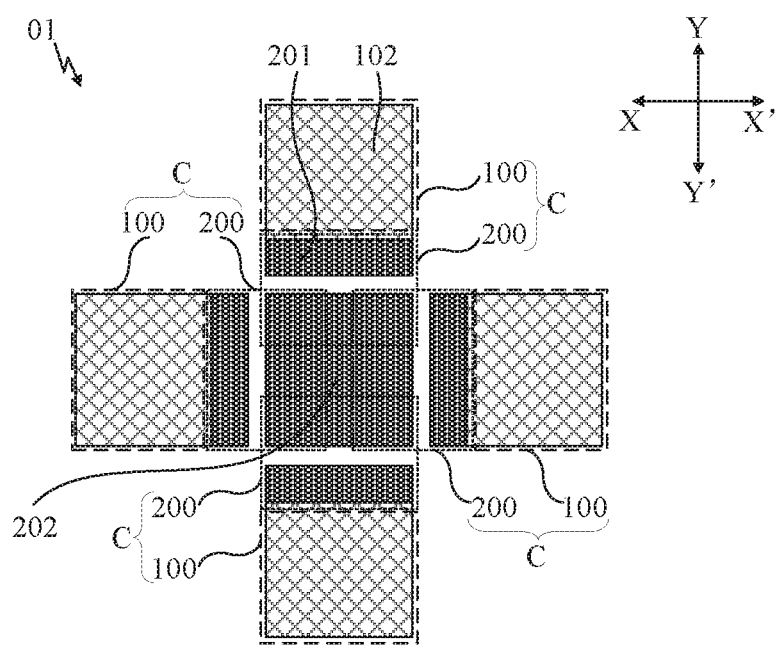
FIG. 5 is a schematic structural diagram of still another pressure sensing unit according to some arrangements of the present disclosure.

For example, referring to FIG. 5, the number of pressure sensing subunit groups is two, and the two pressure sensing subunit groups are disposed in a crossing manner. The arrangement directions of the two pressure sensing subunit groups are perpendicular to each other (for example, the X-X' direction and the Y-Y' direction in FIG. 5), or may be at an angle, which is not limited in some arrangements of the present disclosure.

Referring to FIG. 5, four lateral thin film transistors 200 in the two pressure sensing subunit groups are disposed inside the four vertical thin film transistors 100, and the second electrodes of the four lateral thin film transistors 200 are connected to one another. This can ensure that the pressure sensing unit 01 composed of the two pressure sensing subunit groups has a small projected area, and is also convenient for the second electrodes 202 of the four lateral thin film transistors 200 of the two pressure sensing subunit groups to form an integral structure, thus facilitating the reduction of the total resistance of the pressure sensing unit 01, avoiding the attenuation of the sensing signal of the pressure sensing unit 01, simplifying the manufacturing process of the pressure sensing unit 01, reducing the manufacturing cost thereof, and increasing the degree of integration and so on.

In addition, FIG. 5 is a top view of the corresponding pressure sensing unit 01, which shows only a partial structure of each vertical thin film transistor 100 and each lateral thin film transistor 200 in the pressure sensing unit 01, for example, the second electrode 102 of each vertical thin film transistor 100, the first electrode 201 and the second electrode 202 of each lateral thin film transistor 200. The other components of each of the vertical thin film transistor 100 and each lateral thin film transistor 200 in the pressure sensing unit 01 (for example, the first electrode 101, the semiconductor active layer 103, the insulating support 104, the first air gap 106, and the gate electrode 105 of each vertical thin film transistor 100, the semiconductor active layer 203, the second air gap 206, and the gate electrode 205 of each lateral thin film transistors 200) can be referred to FIG. 4 (it should be understood that FIG. 5 is cross sectional views of respectively the two sensing subunits from the row direction X-X' and the column direction Y-Y', substantially corresponding to FIG. 4.).

It should be noted that, if a plurality of pressure sensing subunit groups are disposed in the pressure sensing unit 01, in the process of arranging each pressure sensing subunit group, a plurality of vertical thin film transistors 100 are distributed on the periphery of the corresponding lateral thin film transistor 200 as much as possible, such that the second electrode 202 of each lateral thin film transistor 200 can be disposed as an integral structure of the same layer and the same material, thus performing signal output (or signal read) through the second electrode of the integral structure.

Figure 6:
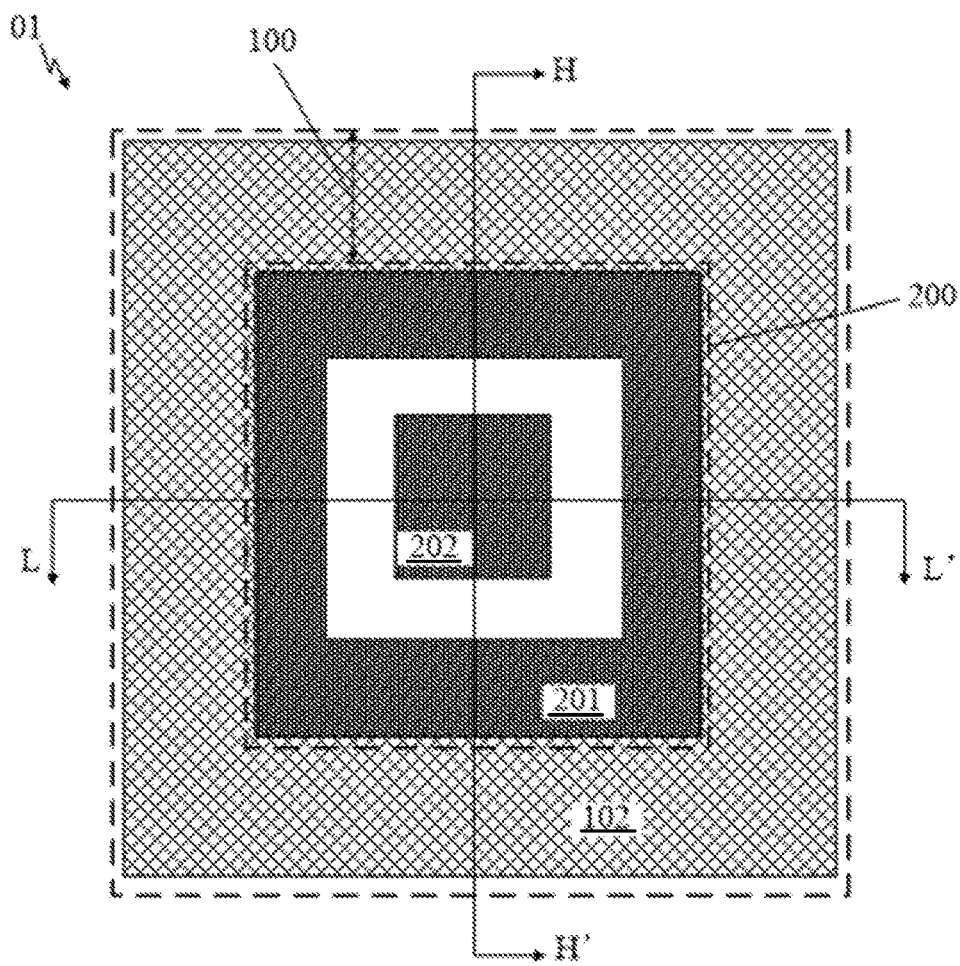
FIG. 6 is a schematic structural diagram of still another pressure sensing unit according to some arrangements of the present disclosure.

In other arrangements, referring to FIG. 6, the number of the vertical thin film transistors 100 and the number of the lateral thin film transistors 200 in the pressure sensing unit 01 are both one. The first electrode 101 and the second electrode 102 of the vertical thin film transistor 100 and the first electrode 201 of the lateral thin film transistor 200 each is a ring-shaped structure. The first electrode 201 of the lateral thin film transistor 200 is disposed inside the first electrode 101 of the vertical thin film transistor 100 (FIG. 6 is a top view corresponding to the pressure sensing unit 01, in which since the first electrode 101 of the vertical thin film transistor 100 is of the same shape as the second electrode 102, and therefore, from the perspective of FIG. 6, the first electrode 101 of the vertical thin film transistor 100 is blocked by its second electrode 102, and is not shown in the drawing.). The second electrode 202 of the lateral thin film transistor 200 is a planar structure, and the second electrode is disposed inside the first electrode 201 of the same lateral thin film transistor 200.

In some arrangements of the present disclosure, the lateral thin film transistor 200 is disposed at the center of the vertical thin film transistor 100 having a ring-shaped structure, which can improve the structural stability of the pressure sensing unit 01, and is advantageous for improving sensitivity of the pressure sensing unit 01 (and sensitivity of the sensor where the pressure sensing unit 01 is disposed) and its reliability in operation.

It should be noted that FIG. 6 is a top view of the corresponding pressure sensing unit 01, which shows only part of the vertical thin film transistor 100 (the portion between the two dotted boxes) and the lateral thin film transistor 200 (the portion inside the inner dotted box), for example, the second electrode 102 of the vertical thin film transistor 100, the first electrode 201 and the second electrode 202 of the lateral thin film transistor 200. Structure of other portions of the vertical thin film transistor 100 and the lateral thin film transistor 200 in the pressure sensing unit 01, such as the first electrode 101, the semiconductor active layer 103, the insulating support 104, and the first air gap 106 and the gate electrode 105 of the vertical thin film transistor 100, the semiconductor active layer 203, the second air gap 206 and the gate electrode 205 of the lateral thin film transistor 200 can be referred to FIG. 4 (it should be understood that FIG. 6 is a cross sectional view of the pressure sensing unit 01 from the direction L-L' and the direction H-H', substantially corresponding to FIG. 4.).

In some arrangements, the first substrate 10 and the second substrate 20 are both flexible substrates, which can expand the field of application of the pressure sensing unit 01. In this regard, the film layers (for example, a gate electrode, a source electrode, or a drain electrode) of each vertical thin film transistor 100 and each lateral thin film transistor 200 are also made of a flexible thin film material such as graphene or the like. The pressure sensing unit 01 thus manufactured is flexible and ultra-thin, and can be better combined with a flexible device for application in a flexible field such as a wearable device.

In addition, the insulating support 104 of each vertical thin film transistor 100 is formed by insulating material, for example, a resin-based material or a photoresist material, which is not limited in some arrangements of the present disclosure.

Accordingly, referring to FIG. 4, the gate electrodes of all the thin film transistors (including the vertical thin film transistor 100 and the lateral thin film transistor 200) in the pressure sensing unit 01 are in an integral structure, and the semiconductor active layers are provided as an integral structure, which can simplify the manufacturing process.

In addition, it should be understood that since the thickness of the vertical thin film transistor 100 is relatively larger than the thickness of the lateral thin film transistor 200, in the actual manufacturing process, generally at least one insulating support 104 is disposed between the gate electrode 105 and the second electrode 102 of the vertical thin film transistor 100 to form a first air gap (the gate insulating layer). For the lateral thin film transistor 200, the insulating support between the semiconductor active layer 203 and the gate electrode 205 may be selectively provided, or omitted (while utilizing the insulating support 104 in the adjacent vertical thin film transistor 100 to form a second air gap 206), thereof according to actual needs, as long as a second air gap 206 (gate insulating layer) is provided between the semiconductor active layer 203 and the gate electrode 205 of each lateral thin film transistor 200.

Figure 7:
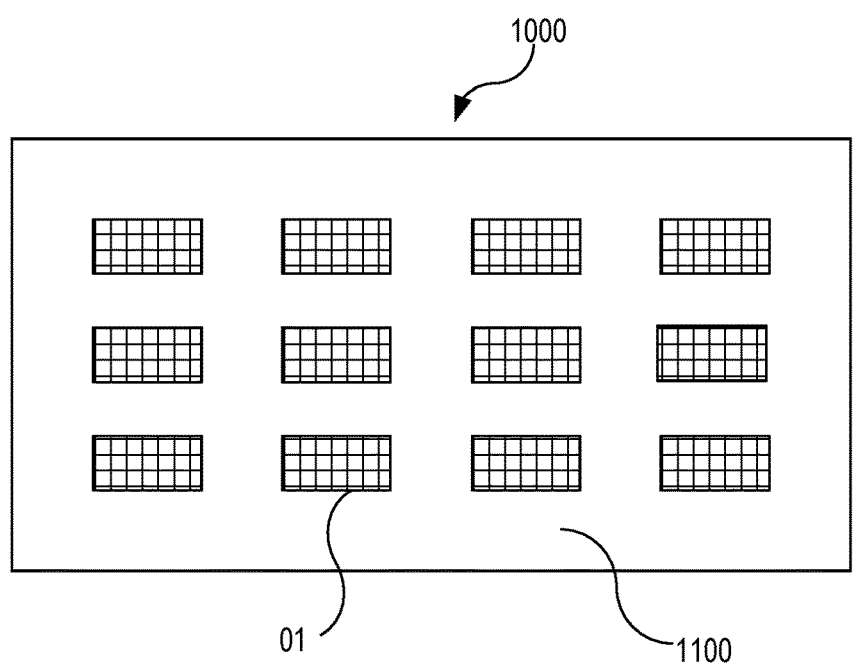
FIG. 7 is a schematic structural diagram of a pressure sensor according to some arrangements of the present disclosure.

Some arrangements of the present disclosure provide a pressure sensor. Referring to FIG. 7, the pressure sensor 1000 includes a base substrate 1100 and at least one of the pressure sensing units 01 of some of the above arrangements disposed on the base substrate 1100. The pressure sensor 1000 has the same advantageous effects as the pressure sensing unit 01 of some of the above arrangements, which will not be repeated herein.

In some arrangements, referring to FIG. 7, there are a plurality of pressure sensing units 01 in the pressure sensor 1000, and the plurality of pressure sensing units 01 are distributed in a matrix form, but are not limited thereto. In addition, some arrangements of the present disclosure do not limit the type of the pressure sensor. For example, the pressure sensor 1000 is a pulse sensor, an ultra-micro force sensor, an acoustic sensor, or the like.

The pressure sensing unit 01 in the pressure sensor 1000 adopts a structure of at least one vertical thin film transistor 100 (or at least one vertical thin film transistor 100 combined with at least one lateral thin film transistor 200), and can effectively reduce the size of the pressure sensor 1000 while ensuring a large current fluctuation, compared to the conventional pressure sensor, which is advantageous for expanding the application range of the pressure sensor 1000. In addition, the pressure sensor 1000 in some arrangements of the present disclosure has advantages of being easy to implement, flexibility, ultra-thin, lightweight, low-radiation, transparent electrons, and the like, compared to conventional pressure sensors.

For example, the pressure sensor 1000 is constituted by the pressure sensing unit 01 shown in FIG. 4. The operation of the pressure sensor 1000 is as follows.

Referring to FIG. 4, a first driving signal is input to the gate electrodes of all the thin film transistors (including the vertical thin film transistor 100 and the lateral thin film transistor 200) in the pressure sensor 1000, and a second driving signal is input to the second electrodes 102 of the two vertical thin film transistors 100 in the pressure sensor 1000. In this way, when the pressure sensor 1000 is not pressed (that is, the pressure sensing unit 1000 has no pressure signal), the second electrodes 202 of the two lateral thin film transistors 200 of the pressure sensor 1000 in an integral structure can output a small current signal.

When the pressure sensor 1000 is subjected to a pressure signal (for example, is pressed), the thickness of the first air gap 106 in the two vertical thin film transistors 100 and the thickness of the second air gap 206 in the two lateral thin film transistors 200 may change. That is, the gate capacitance in each thin film transistor is changed, such that the channel current of each thin film transistor can change. Thus, with the second electrodes 202 of the integral structure in the two lateral thin film transistors 200, the changed current signals superimposed by the four thin film transistors can be obtained. The changed current signal has a large current fluctuation compared to the current signal when not pressed. Therefore, the pressure sensor 1000 in some arrangements of the present disclosure has a higher pressure sensing sensitivity and is capable of detecting change in ultra-low pressure signals.

Some arrangements of the present disclosure also provide a pressure sensing device. The pressure sensing device includes the pressure sensor provided by some of the above arrangements. The pressure sensing device has the same advantageous effects as the pressure sensor of some of the above arrangements, which will not be repeated herein.

Figure 8:
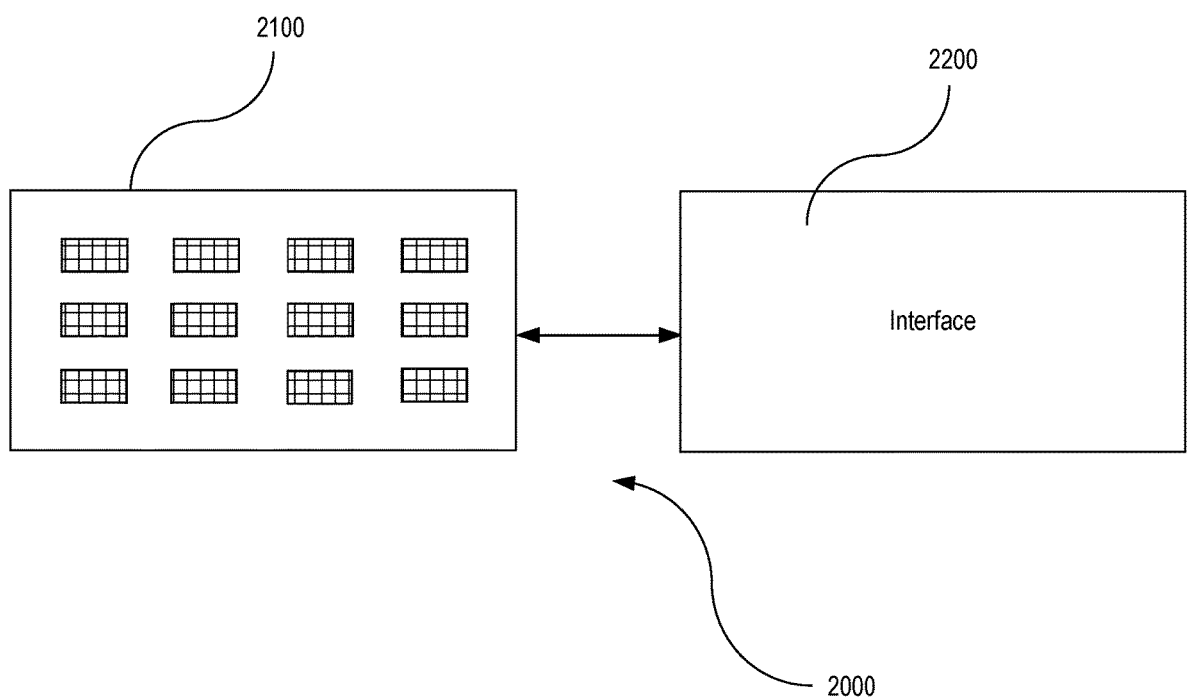
FIG. 8 is a schematic structural diagram of a pressure sensing device according to some arrangements of the present disclosure.

Referring to FIG. 8, the pressure sensing device 2000 includes a pressure sensor 2100 and an interface 2200. The pressure sensor 2100 may include the pressure sensor 1000 according to the above arrangements, and the pressure sensor 2100 is coupled to the interface 2200. The interface 2200 may be coupled to external devices for signal transmission and/or power supply. In one arrangement, the interface 2200 may be implemented by a circuit that is configured to couple the pressure sensor 2100 to the external devices. In other arrangement, the interface may be a programmable logical circuit or a processor that is configured to receive data from the pressure sensor and send the data to external devices.

In some examples, the pressure sensing device is at least applied to the field of wearable devices, for example, the pressure sensing device is a pulse sensor. In other examples, the pressure sensing device is applied to the field of fingerprint recognition or touch control, etc., for example, the pressure sensing device is a mobile phone or a computer. Some arrangements of the present disclosure do not limit this.

In the description of the above arrangements, specific features, structures, materials or characteristics may be combined in any suitable manner in any one or more arrangements or examples.

The above is only the specific arrangement of the present disclosure, but the scope of the present disclosure is not limited thereto, and changes or substitutions easily contemplated by any person skilled in the art within the technical scope of the disclosure should be covered within the scope of protection of the present disclosure. Therefore, the scope of protection of the present disclosure should be determined by the scope of the claims.

What is claimed is:

1. A pressure sensing unit comprising:
    a first substrate and a second substrate opposite to each other; and
    at least one vertical thin film transistor disposed between the first substrate and the second substrate;
    wherein each vertical thin film transistor comprises: a first electrode, a semiconductor active layer, a second electrode, at least one insulating support, and a gate electrode sequentially disposed in a direction extending from the first substrate to the second substrate; and a first air gap is formed between the gate electrode and the second electrode of each vertical thin film transistor by the presence of the at least one insulating support.

2. The pressure sensing unit according to claim 1, further comprising: at least one lateral thin film transistor disposed between the first substrate and the second substrate;
    each lateral thin film transistor comprises a gate electrode, a first electrode, a second electrode, and a semiconductor active layer;
    wherein the first electrode and the second electrode of each lateral thin film transistor are respectively disposed in a same layer as the first electrode of each vertical thin film transistor; the first electrode of each lateral thin film transistor is connected to the first electrode of an adjacent vertical thin film transistor;
    the gate electrode of each lateral thin film transistor is disposed in a same layer as the gate electrode of each vertical thin film transistor; the semiconductor active layer of each lateral thin film transistor is disposed in a same layer as the semiconductor active layer of each vertical thin film transistor; and a second air gap is formed between the gate electrode and the semiconductor active layer of each lateral thin film transistor.

3. The pressure sensing unit according to claim 2, wherein the second air gap in each of the lateral thin film transistors is formed by the presence of the at least one insulating support in the adjacent vertical thin film transistor.

4. The pressure sensing unit according to claim 2, wherein the first electrode of each lateral thin film transistor is in an integral structure with the first electrode of the adjacent vertical thin film transistor.

5. The pressure sensing unit according to claim 2, wherein one of the vertical thin film transistors and one of the lateral thin film transistors connected to the first electrode of said one vertical thin film transistor constitute a pressure sensing subunit;
    the pressure sensing unit comprises at least one pressure sensing subunit group, and each pressure sensing subunit group comprises two pressure sensing subunits symmetrically centered on a reference plane; and the reference plane is a plane passing through a geometric center of the first substrate and perpendicular to the first substrate.

6. The pressure sensing unit according to claim 5, wherein in each pressure sensing subunit group, two lateral thin film transistors are disposed between the two vertical thin film transistors, and the second electrodes of the two lateral thin film transistors are connected to each other.

7. The pressure sensing unit according to claim 5, wherein the number of the pressure sensing subunit groups is two, and the two pressure sensing subunit groups are arranged in a crossing manner;
four lateral thin film transistors in the two pressure sensing subunit groups are dispose inside four vertical thin film transistors, and the second electrodes of the four lateral thin film transistors are connected to one another.

8. The pressure sensing unit according to claim 7, wherein the second electrodes of the four lateral thin film transistors form an integral structure.

9. The pressure sensing unit according to claim 2, wherein the number of the vertical thin film transistors and the number of the lateral thin film transistors are both one;
the first electrode and the second electrode of the vertical thin film transistor and the first electrode of the lateral thin film transistor each is a ring-shaped structure; the first electrode of the lateral thin film transistor is disposed inside the first electrode of the vertical thin film transistor; and
the second electrode of the lateral thin film transistor is a planar structure, and the second electrode of the lateral thin film transistor is disposed inside the first electrode of the lateral thin film transistor.

10. The pressure sensing unit according to claim 1, wherein the first substrate and the second substrate are both flexible substrates.

11. The pressure sensing unit according to claim 2, wherein the semiconductor active layer of each lateral thin film transistor is in an integral structure with the semiconductor active layer of the adjacent vertical thin film transistor.

12. The pressure sensing unit according to claim 2, wherein the gate electrode of each lateral thin film transistor is in an integral structure with the gate electrode of the adjacent vertical thin film transistor.

13. A pressure sensor comprising:
a base substrate; and
at least one pressure sensing unit disposed on the base substrate,
wherein the pressure sensing unit comprises:
a first substrate and a second substrate opposite to each other; and
at least one vertical thin film transistor disposed between the first substrate and the second substrate;
wherein each vertical thin film transistor comprises: a first electrode, a semiconductor active layer, a second electrode, at least one insulating support, and a gate electrode sequentially disposed in a direction extending from the first substrate to the second substrate; and a first air gap is formed between the gate electrode and the second electrode of each vertical thin film transistor by the presence of the at least one insulating support.

14. The pressure sensor according to claim 13, wherein the pressure sensing unit further comprises: at least one lateral thin film transistor disposed between the first substrate and the second substrate;
each lateral thin film transistor comprises a gate electrode, a first electrode, a second electrode, and a semiconductor active layer;
wherein the first electrode and the second electrode of each lateral thin film transistor are respectively disposed in a same layer as the first electrode of each vertical thin film transistor; the first electrode of each lateral thin film transistor is connected to the first electrode of an adjacent vertical thin film transistor;
the gate electrode of each lateral thin film transistor is disposed in a same layer as the gate electrode of each vertical thin film transistor; the semiconductor active layer of each lateral thin film transistor is disposed in a same layer as the semiconductor active layer of each vertical thin film transistor; and a second air gap is formed between the gate electrode and the semiconductor active layer of each lateral thin film transistor.

15. The pressure sensor according to claim 14, wherein the second air gap in each of the lateral thin film transistors is formed by the presence of the at least one insulating support in the adjacent vertical thin film transistor.

16. The pressure sensor according to claim 14, wherein the first electrode of each lateral thin film transistor is in an integral structure with the first electrode of the adjacent vertical thin film transistor.

17. The pressure sensor according to claim 14, wherein wherein the semiconductor active layer of each lateral thin film transistor is in an integral structure with the semiconductor active layer of the adjacent vertical thin film transistor.

18. The pressure sensor according to claim 14, wherein wherein the gate electrode of each lateral thin film transistor is in an integral structure with the gate electrode of the adjacent vertical thin film transistor.

19. A pressure sensing device, comprising:
an interface; and
a pressure sensor coupled to the interface; and
wherein the pressure sensor comprises:
a base substrate; and
at least one pressure sensing unit disposed on the base substrate,
wherein the pressure sensing unit comprises:
a first substrate and a second substrate opposite to each other; and
at least one vertical thin film transistor disposed between the first substrate and the second substrate;
wherein each vertical thin film transistor comprises: a first electrode, a semiconductor active layer, a second electrode, at least one insulating support, and a gate electrode sequentially disposed in a direction extending from the first substrate to the second substrate; and a first air gap is formed between the gate electrode and the second electrode of each vertical thin film transistor by the presence of the at least one insulating support.

20. The pressure sensing device according to claim 19, wherein the pressure sensing unit further comprises: at least one lateral thin film transistor disposed between the first substrate and the second substrate;
each lateral thin film transistor comprises a gate electrode, a first electrode, a second electrode, and a semiconductor active layer;
wherein the first electrode and the second electrode of each lateral thin film transistor are respectively disposed in a same layer as the first electrode of each vertical thin film transistor; the first electrode of each lateral thin film transistor is connected to the first electrode of an adjacent vertical thin film transistor;

the gate electrode of each lateral thin film transistor is disposed in a same layer as the gate electrode of each vertical thin film transistor; the semiconductor active layer of each lateral thin film transistor is disposed in a same layer as the semiconductor active layer of each vertical thin film transistor; and a second air gap is formed between the gate electrode and the semiconductor active layer of each lateral thin film transistor.

* * * * *